US011878464B2

United States Patent
Luan et al.

(10) Patent No.: US 11,878,464 B2
(45) Date of Patent: Jan. 23, 2024

(54) PREDICTING THERMAL BEHAVIOR IN 3D PRINTERS

(71) Applicant: Hewlett-Packard Development Company, L.P., Spring, TX (US)

(72) Inventors: He Luan, Palo Alto, CA (US); Jun Zeng, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 375 days.

(21) Appl. No.: 17/047,303

(22) PCT Filed: Aug. 10, 2018

(86) PCT No.: PCT/US2018/046154
§ 371 (c)(1),
(2) Date: Oct. 13, 2020

(87) PCT Pub. No.: WO2020/032963
PCT Pub. Date: Feb. 13, 2020

(65) Prior Publication Data
US 2021/0150343 A1    May 20, 2021

(51) Int. Cl.
*B33Y 50/02* (2015.01)
*B29C 64/20* (2017.01)
(Continued)

(52) U.S. Cl.
CPC .............. *B29C 64/20* (2017.08); *B22F 10/85* (2021.01); *B33Y 50/02* (2014.12); *G06F 30/27* (2020.01);
(Continued)

(58) Field of Classification Search
None
See application file for complete search history.

(56) References Cited

U.S. PATENT DOCUMENTS

2015/0331402 A1    11/2015  Lin
2016/0148850 A1     5/2016  David
(Continued)

FOREIGN PATENT DOCUMENTS

WO    WO-2015106840 A1 *  7/2015  ........... B29C 64/386
WO    WO-2016050319        8/2016
(Continued)

*Primary Examiner* — Yung-Sheng M Tsui
*Assistant Examiner* — Melody Tsui
(74) *Attorney, Agent, or Firm* — Shook, Hardy & Bacon L.L.P.

(57) ABSTRACT

A system includes a machine readable storage medium storing instructions and a processor. The processor is to execute instructions to receive contone agent maps of a three-dimensional (3D) part and sensed thermal maps from the 3D printing of the 3D part on a 3D printer. The processor is to execute instructions to generate layer sequences including the contone agent maps and the sensed thermal map for each layer of the 3D part. The processor is to execute instructions to select training samples from the layer sequences having temperature intensity variations within each layer or between neighboring layers. The processor is to execute instructions to train a neural network using the training samples to generate a model to predict thermal behavior in the 3D printer.

11 Claims, 8 Drawing Sheets

(51) Int. Cl.
  *G06N 3/08* (2023.01)
  *B22F 10/85* (2021.01)
  *G06N 3/044* (2023.01)
  *G06N 3/045* (2023.01)
  *G06F 30/27* (2020.01)
  *B22F 10/20* (2021.01)
  *B29C 64/393* (2017.01)

(52) U.S. Cl.
  CPC ............ *G06N 3/044* (2023.01); *G06N 3/045* (2023.01); *G06N 3/08* (2013.01); *B22F 10/20* (2021.01); *B29C 64/393* (2017.08)

(56) References Cited

U.S. PATENT DOCUMENTS

| | | | |
|---|---|---|---|
| 2017/0312614 A1 | 11/2017 | Tran | |
| 2018/0065297 A1 | 3/2018 | Zhao | |
| 2018/0095450 A1* | 4/2018 | Lappas | ................. G06T 19/00 |
| 2018/0341248 A1* | 11/2018 | Mehr | ................. G05B 19/4099 |
| 2019/0134709 A1* | 5/2019 | Dave | ................. B33Y 30/00 |
| 2019/0188346 A1* | 6/2019 | Mirabella | ................. B23K 26/34 |

FOREIGN PATENT DOCUMENTS

| | | | |
|---|---|---|---|
| WO | WO-2016186613 A1 * | 11/2016 | ........... B29C 64/165 |
| WO | WO-2016200384 A1 * | 12/2016 | ........... B29C 64/165 |
| WO | WO-2017131613 | 8/2017 | |
| WO | WO-2017196345 | 11/2017 | |

\* cited by examiner

PREDICTING THERMAL BEHAVIOR IN 3D PRINTERS

BACKGROUND

Printing technologies may be used to create three-dimensional (3D) objects from data output from, for example, a computerized modeling source. For example, a 3D object may be designed using a computer program (e.g., a computer aided design (CAD) application) to generate a 3D model of the object, and the computer may output the data of the 3D model to a printing system capable of forming the solid 3D object. Solid free-form fabrication (or layer manufacturing) may be defined generally as a fabrication technology used to build a 3D object using layer by layer or point-by-point fabrication. With this fabrication process, complex shapes may be formed without the use of a pre-shaped die or mold.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

In three-dimensional (3D) printers, such as multi jet fusion 3D printers, the end part quality may be directly related to the voxel level thermal behavior in the build bed of the 3D printer. Accordingly, disclosed herein is a deep neural network (DNN) that is trained to generate models for predicting thermal behavior in 3D printers. The datasets used to train the DNN are automatically generated from machine instructions and sensed thermal data. To generate the training datasets, layer sequences are generated from the machine instructions and the sensed thermal data. Patch sequences (i.e., sublayer sequences) may be generated from the layer sequences. Training samples may be selected from the layer sequences or patch sequences based on three screening criteria described herein. Once the DNN is trained using the training samples to generate a build bed level model or a patch level model, the model may be used to predict the thermal behavior of the 3D printer. For example, the model may be used to predict the thermal distribution map of a fusing layer before the layer is printed so that the printing of a part may be modified prior to printing to improve the end part quality.

Figure 1:
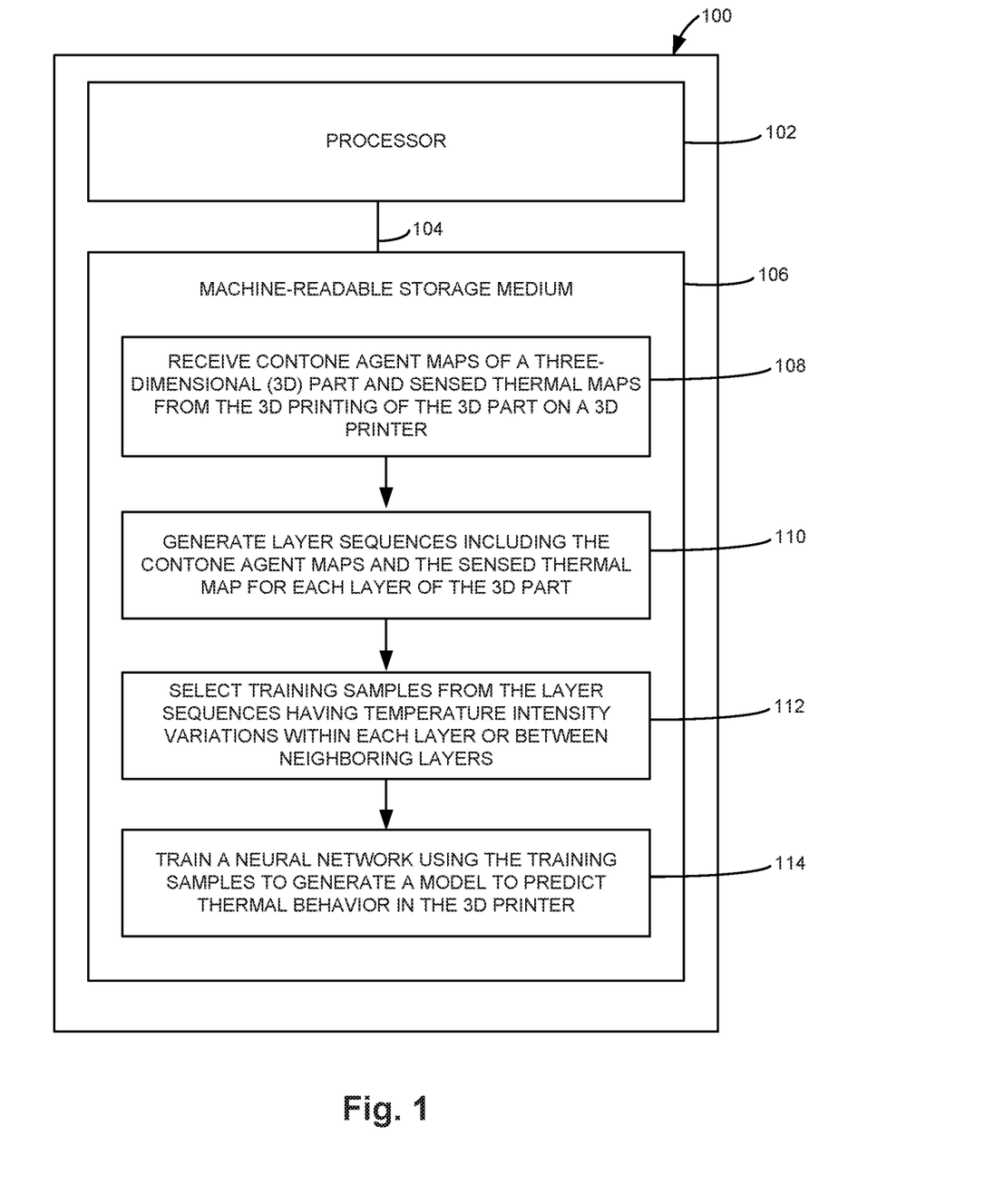
FIG. 1 is a block diagram illustrating one example of a processing system for training a neural network.

FIG. 1 is a block diagram illustrating one example of a processing system 100 for training a neural network. Additional details for training a neural network will be discussed with reference to the following FIGS. 2A-6. System 100 includes a processor 102 and a machine-readable storage medium 106. Processor 102 is communicatively coupled to machine-readable storage medium 106 through a communication path 104. Although the following description refers to a single processor and a single machine-readable storage medium, the description may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 102 includes one (i.e., a single) central processing unit (CPU) or microprocessor or graphics processing unit (GPU) or more than one (i.e., multiple) CPU or microprocessor or GPU, and/or other suitable hardware devices for retrieval and execution of instructions stored in machine-readable storage medium 106. Processor 102 may fetch, decode, and execute instructions 108-114 to train a neural network.

Processor 102 may fetch, decode, and execute instructions 108 to receive contone agent maps of a three-dimensional (3D) part and sensed thermal maps from the 3D printing of the 3D part on a 3D printer. Processor 102 may fetch, decode, and execute instructions 110 to generate layer sequences including the contone agent maps and the sensed thermal map for each layer of the 3D part.

Processor 102 may fetch, decode, and execute instructions 112 to select training samples from the layer sequences having temperature intensity variations within each layer or between neighboring layers. Processor 102 may fetch, decode, and execute instructions 114 to train a neural network using the training samples to generate a model to predict thermal behavior in the 3D printer. In one example, processor 102 may execute the instructions to select training samples to select first samples from each layer sequence having temperature intensity variations within each layer or between neighboring layers, select second samples from the first samples where the temperature intensity variations are influenced by the contone agent maps, and select third samples from the first samples where the temperature intensity variations are influenced by neighboring layers. In this example, the first samples, the second samples, and the third samples may be used to train the neural network.

In one example, processor 102 may execute the instructions to train the neural network to train a spatial convolution neural network (CNN) using the second samples. In another example, processor 102 may execute the instructions to train the neural network to train a spatiotemporal convolution long short-term memory network (Conv-LSTM) using the third samples. In another example, processor 102 may execute the instructions to train the neural network to train a synthesis CNN using the first samples while fixing the parameters in the spatial CNN and the Conv-LSTM as pre-trained parameters.

Processor 102 may execute instructions to further segment the contone agent maps and the sensed thermal maps for each layer of the 3D part into patches and generate patch sequences based on the segmented contone agent maps and the segmented sensed thermal maps of each layer sequence of the 3D part. In this example, processor 102 may execute the instructions to select training samples from the patch sequences having temperature intensity variations within each layer or between neighboring layers.

Processor 102 may execute the instructions to further generate layer sequences including contone agent maps for a part to be printed on the 3D printer and apply the model to the contone agent maps for the part to be printed to predict the thermal behavior of the 3D printer. The contone agent maps may include fusing agent distribution maps and detailing agent distribution maps.

As an alternative or in addition to retrieving and executing instructions, processor 102 may include one (i.e., a single) electronic circuit or more than one (i.e., multiple) electronic circuit comprising a number of electronic components for performing the functionality of one of the instructions or more than one of the instructions in machine-readable storage medium 106. With respect to the executable instruction representations (e.g., boxes) described and illustrated herein, it should be understood that part or all of the executable instructions and/or electronic circuits included within one box may, in alternate examples, be included in a different box illustrated in the figures or in a different box not shown.

Machine-readable storage medium 106 is a non-transitory storage medium and may be any suitable electronic, magnetic, optical, or other physical storage device that stores executable instructions. Thus, machine-readable storage medium 106 may be, for example, random access memory (RAM), an electrically-erasable programmable read-only memory (EEPROM), a storage drive, an optical disc, and the like. Machine-readable storage medium 106 may be disposed within system 100, as illustrated in FIG. 1. In this case, the executable instructions may be installed on system 100. Alternatively, machine-readable storage medium 106 may be a portable, external, or remote storage medium that allows system 100 to download the instructions from the portable/external/remote storage medium. In this case, the executable instructions may be part of an installation package.

Figure 2:
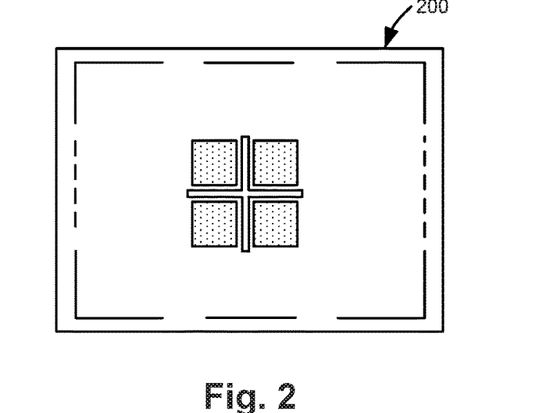
FIG. 2 illustrates one example of a shape map.

FIG. 2 illustrates one example of a shape map 200. Shape map 200 includes a two-dimensional (2D) slice or layer of a 3D model (e.g., a 3D mesh and/or stack of 2D vector slices) of a part to be printed on a 3D printer. Each 2D slice or layer of a 3D model of a part may be referred to as an "image". A 3D model of a part may be divided into a plurality of sequential shape maps. A shape map may be used to generate a fusing agent distribution map and a detailing agent distribution map for the layer.

Figure 3A:
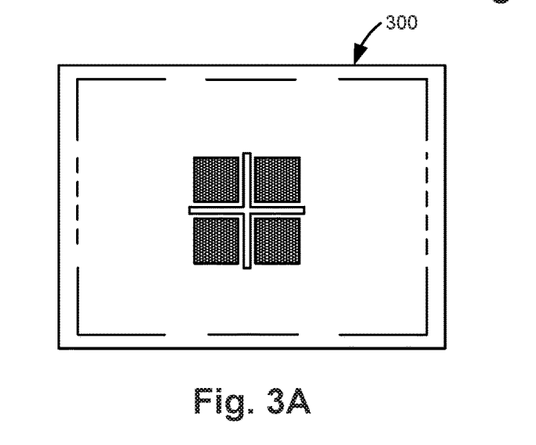
FIG. 3A illustrates one example of a fusing agent distribution map.

FIG. 3A illustrates one example of fusing agent distribution map 300. Fusing agent distribution map 300 is a contone agent map used to control the fusing agents that control the in-take thermal intensity for generating the shape defined by the shape map for the layer.

Figure 3B:
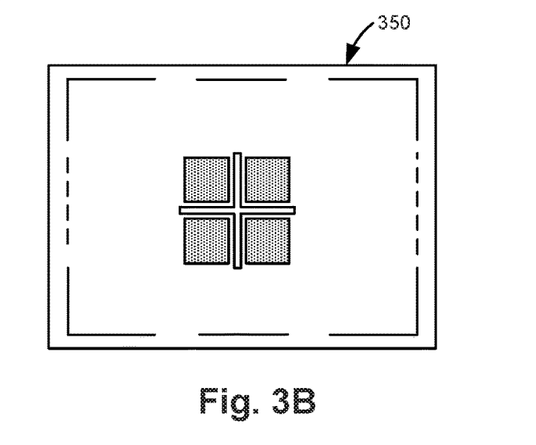
FIG. 3B illustrates one example of a detailing agent distribution map.

FIG. 3B illustrates one example of a detailing agent distribution map 350. Detailing agent distribution map 350 is a contone agent map used to control the out-take thermal intensity for generating the shape defined by the shape map for the layer. The fusing agent distribution map and the detailing agent distribution map drive the writing system of the 3D printer to control energy deposition at the voxel level.

Figure 4A:
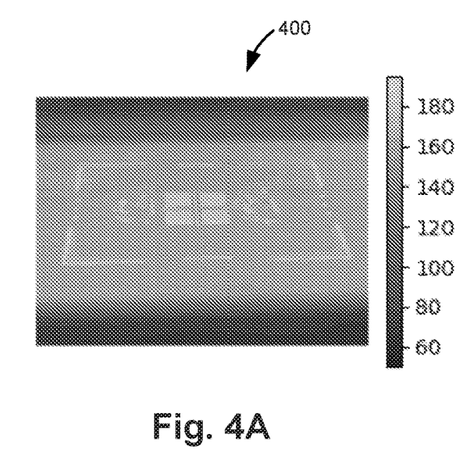
FIG. 4A illustrates one example of a sensed thermal map.

FIG. 4A illustrates one example of a sensed thermal map 400. Thermal map 400 may be sensed by an infrared camera while a layer of a part is being printed on a 3D printer. Thermal map 400 may provide thermal data for the layer being printed down to the voxel level. The camera used to capture the thermal image of the layer being printed may be positioned outside of the printer. Accordingly, due to the positioning of the camera, the image sensed by the camera may be distorted resulting in a distorted thermal map. A thermal map may be captured for each layer of parts being printed on a 3D printer and linked to the contone agent maps for the corresponding layer.

Figure 4B:
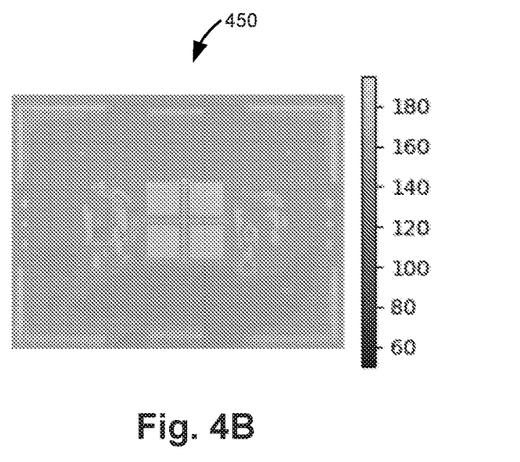
FIG. 4B illustrates one example of an undistorted sensed thermal map after correcting the sensed thermal map of FIG. 4A to remove distortion.

FIG. 4B illustrates one example of an undistorted sensed thermal map 450 after correcting sensed thermal map 400 of FIG. 4A to remove distortion. Thermal map 400 is corrected to provide an undistorted thermal map 450, which has been corrected to account for the positioning and projection angle of the camera. Thermal map 450 and/or contone agent maps 300 and 350 may also be scaled (e.g., upscaled or downscaled) to match the resolution of each other.

Figure 5:
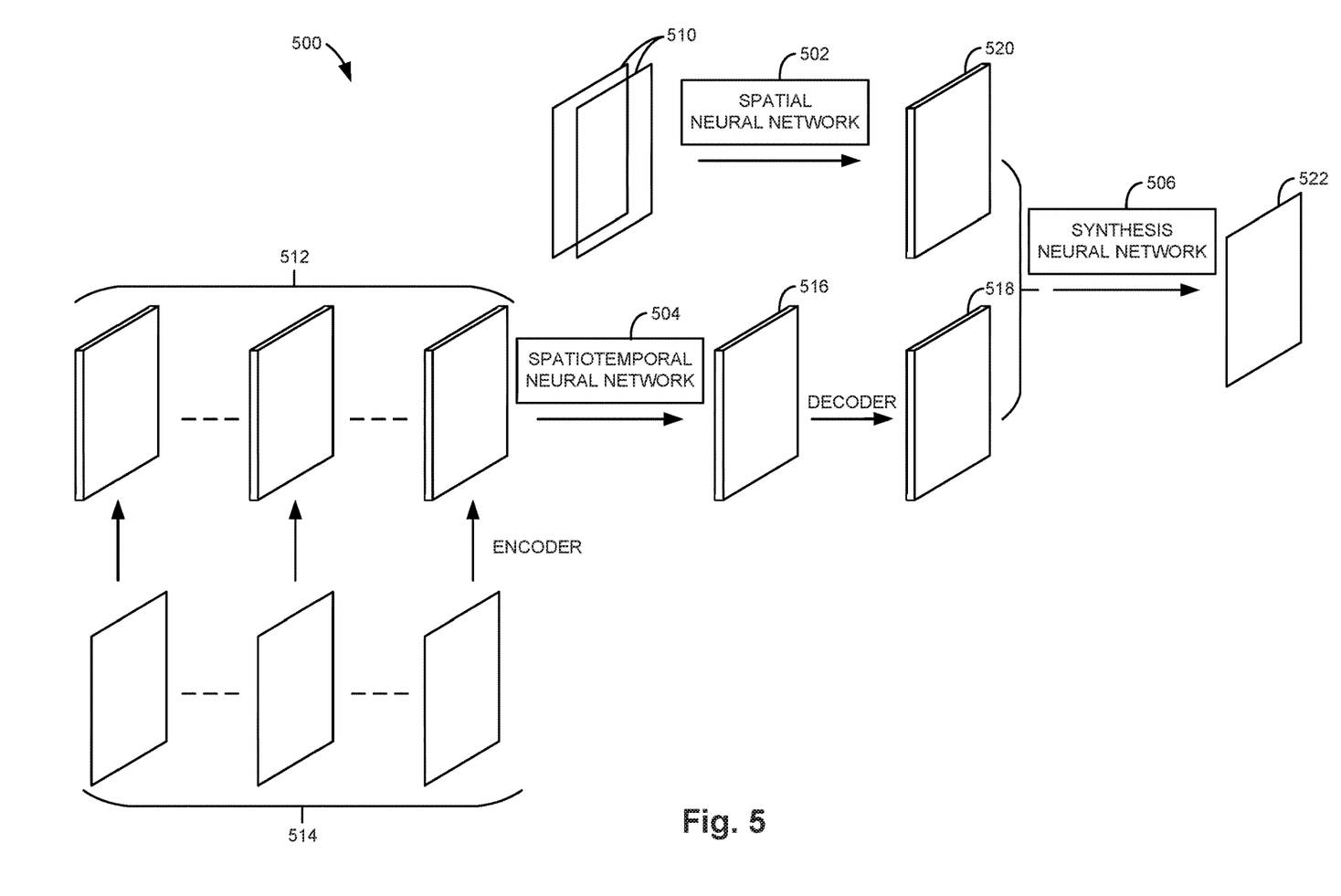
FIG. 5 is a block diagram illustrating one example of a neural network architecture.

FIG. 5 is a block diagram illustrating one example of a neural network architecture 500. The neural network architecture takes the above described contone agent maps and thermal maps as input and predicts the fusing layer heat maps before they are printed. The architecture contains three main components that may be trained separately or simultaneously to investigate different thermal contributors. Therefore, dataset screening criteria may be used to select the suitable subset of datasets for the training of each component.

Neural network architecture 500 may be a deep neural network (DNN) architecture and may include a spatial neural network 502 (e.g., a convolution neural network (CNN)), a spatiotemporal neural network 504 (e.g., a convolution long-short term memory network (Conv-LSTM)), or a synthesis neural network 506 (e.g., a CNN). Neural network architecture 500 may include one of spatial neural network 502, spatiotemporal neural network 504, or synthesis neural network 506 or any combination of spatial neural network 502, spatiotemporal neural network 504, and synthesis neural network 506. Spatial neural network 502 learns the heat map generated due to the k-th layer contone agent maps (i.e., the fusing and detailing agent maps) indicated at 510 to predict the k-th layer heat map indicated at 520. Spatiotemporal neural network 504 learns the layer heat transferred from previous layers indicated at 512, which are encoded from the sensed thermal maps indicated at 514. The learned heat map indicated at 516 is decoded to predict the k-th layer heat map indicated at 518. The synthesis neural network 506 learns the contributions of the spatial neural network 502 and the spatiotemporal neural network 504 to generate a combined heat map prediction for the k-th layer as indicated at 522.

In the model training and prediction, two scalable solutions accounting for the build bed level influence may be used. A patch level solution splits each layer into patches for training and prediction to preserve finer details. A build bed level solution uses the full build bed map but may be scaled down somewhat before feeding into the DNN and scaled back up after the DNN. Both solutions may employ the same architecture and may train the whole architecture simultaneously. Datasets for both solutions may be generated automatically as described below.

Figure 6:
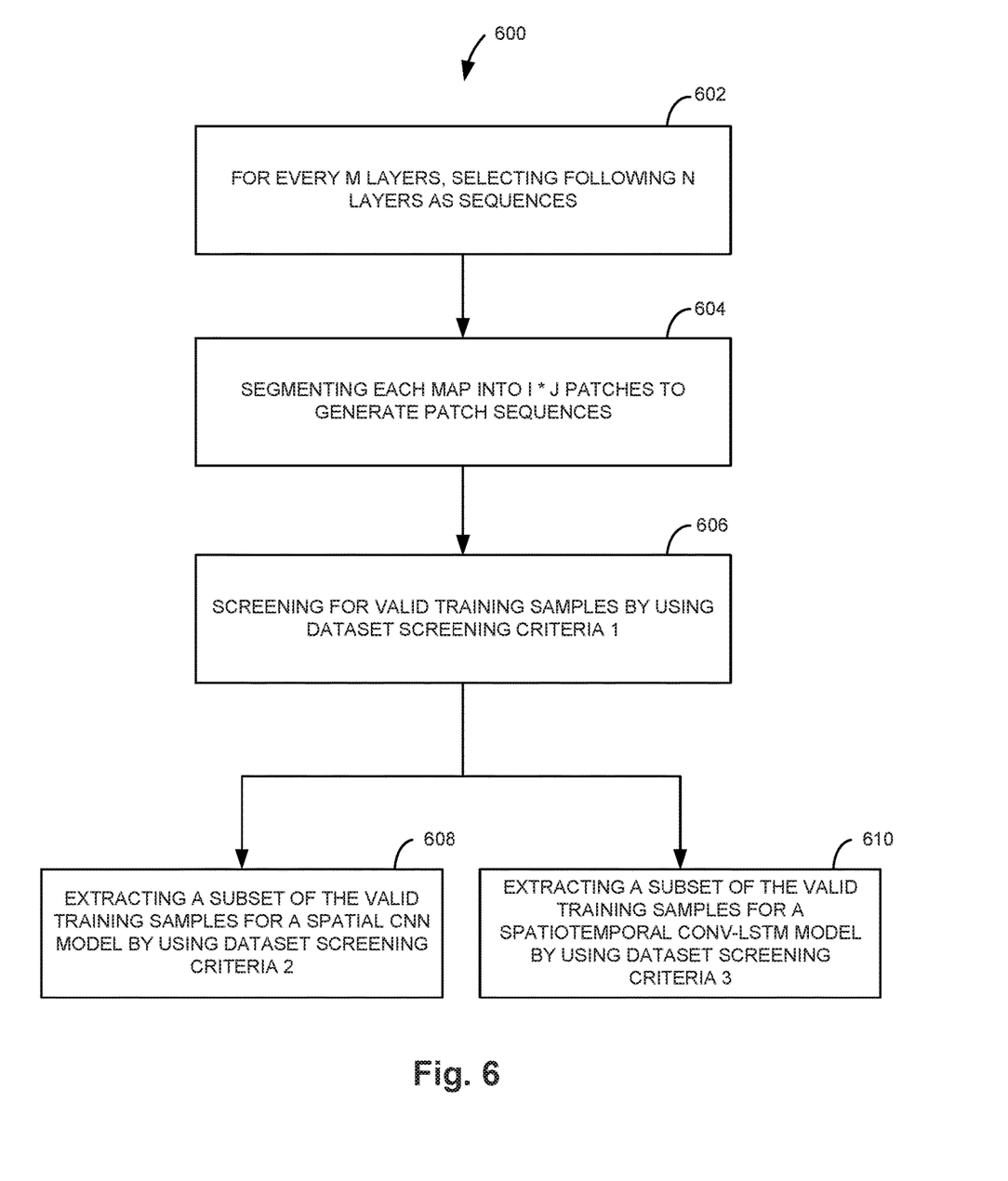
FIG. 6 is a flow diagram illustrating one example of a method for generating training datasets for a neural network.

FIG. 6 is a flow diagram illustrating one example of a method 600 for generating training datasets for a neural network, such as the neural network of FIG. 5. Prior to generating the training datasets, the raw data including the contone agent maps and the sensed thermal maps described above are obtained and provided to the model training. From the raw data, the sensed thermal maps may be corrected (i.e., undistorted) as previously described and illustrated with reference to FIGS. 4A and 4B. After the correction for any distortion and upscaling or downscaling to align the resolutions, the thermal sensing maps have the same resolution as the contone agent maps. In the following method, the sensed thermal maps and the contone agent maps are treated as a pair.

At 602, method 600 includes for every M layers, selecting the following N layers as sequences. Starting from the first layer, for every M layers, the following N successive layers are selected as a sequence. These may provide the training sets for the build bed level solution. In one example, N=30 considering the computational load and experimental analysis on heat transfer, and M=10 for an adoption of the last 10 layers in each sequence as a prediction.

At 604, method 600 includes segmenting each sequence map into I*J patches to generate patch sequences. In one example, each sequence map is segmented into I*J patches with thermal stride overlapping. As used herein, "thermal stride" is the pixels around each patch to account for the thermal diffusion between patches. The result is patch sequences with size N*I*J. These may provide the training sets for the patch level solution. In one example, I=J=100 considering the DNN complexity, but they can also be larger or smaller.

At 606, method 600 includes screening for valid training samples by using dataset screening criteria 1, which will be described below. At 608, method 600 includes extracting a subset of the valid training samples for a spatial CNN model by using dataset screening criteria 2, which will be described below. At 610, method 600 includes extracting a subset of the valid training samples for a spatiotemporal Conv-LSTM model by using dataset screening criteria 3, which will be described below.

Dataset screening criteria 1 includes: 1) In the patch sequences, the layers have temperature intensity variations within each layer (e.g., not all with the same temperature) to make sure there is enough information to learn; and/or 2) In the patch sequences, there are temperature intensity variations between neighboring layers to obtain more information in learning heat transfer. Screening criteria 1 may be implemented by: 1) Calculating Shannon entropy of heat maps in each patch sequence by using the following equation:

$$H(X) = -\Sigma_{i=0}^{n-1} p_i \log_2 p_i$$

where pi is the probability of each heat maps pixel value in the whole patch sequence; and 2) Selecting the sequence pairs with heat entropy greater than a threshold. In one example, the threshold equals 3.4. The Shannon entropy reflects the average amount of information provided by a patch sequence. So by using entropy, the patch sequences without enough intralayer and/or interlayer variations are screened out. In other examples, other variations of information entropy oriented criterion may be applied, such as the entropy of a contone agent map sequence or the weighted average entropy of heat map and contone agent map sequences.

Dataset screening criteria 2 includes the heat maps that are mainly influenced by contone agent maps. In other words, any area where the heat is mainly influenced by heat transfer from previous layers could not be found. Screening criteria 2 may be implemented by: 1) Filtering out the map pairs with a blank fluid layer; 2) Setting the pixel values in a heat map to the build bed temperature value if the contone agent map has shape; 3) Calculating the entropy of each modified heat map; 4) Calculating the entropy of each contone agent map; and 5) Select the map pairs with modified heat map entropy less than a threshold or contone agent map entropy greater than a threshold. The second step aims to build a modified heat map that shows the difference between the heat map and the corresponding contone agent maps. If such map becomes almost uniform, it indicates that the contone agent maps mainly influence the heap map and such modified heat map has relatively low entropy (less information). In addition, if the patch covers a big part area, it would also contain abundant useful information. So this criteria also selects the patch with high contone agent map entropy.

Dataset screening criteria 3 includes the sequences where heat transfer from previous layers mainly influences heat maps. Patch layers in one sequence change gradually and do not have a sharp change to make sure there are detectable changes in the contone agent maps to influence the thermal energy. Screening criteria 3 may be implemented by: 1) In each patch sequence, calculating the contone agent map entropy of each layer; 2) Calculating the subtraction of two successive layers' contone agent map entropy; and 3) For those N−1 subtraction values, if the number of non-positive or non-negative values is greater than a threshold, then select this patch sequence. In one example, the threshold equals 23. The contone agent maps could reflect the part shape. If the contone agent map entropy gradually decreases or increase in one sequence, it will indicate that the shape gradually changes between layers. Such sequences could enable improved learning of the heat transfer.

Figure 7:
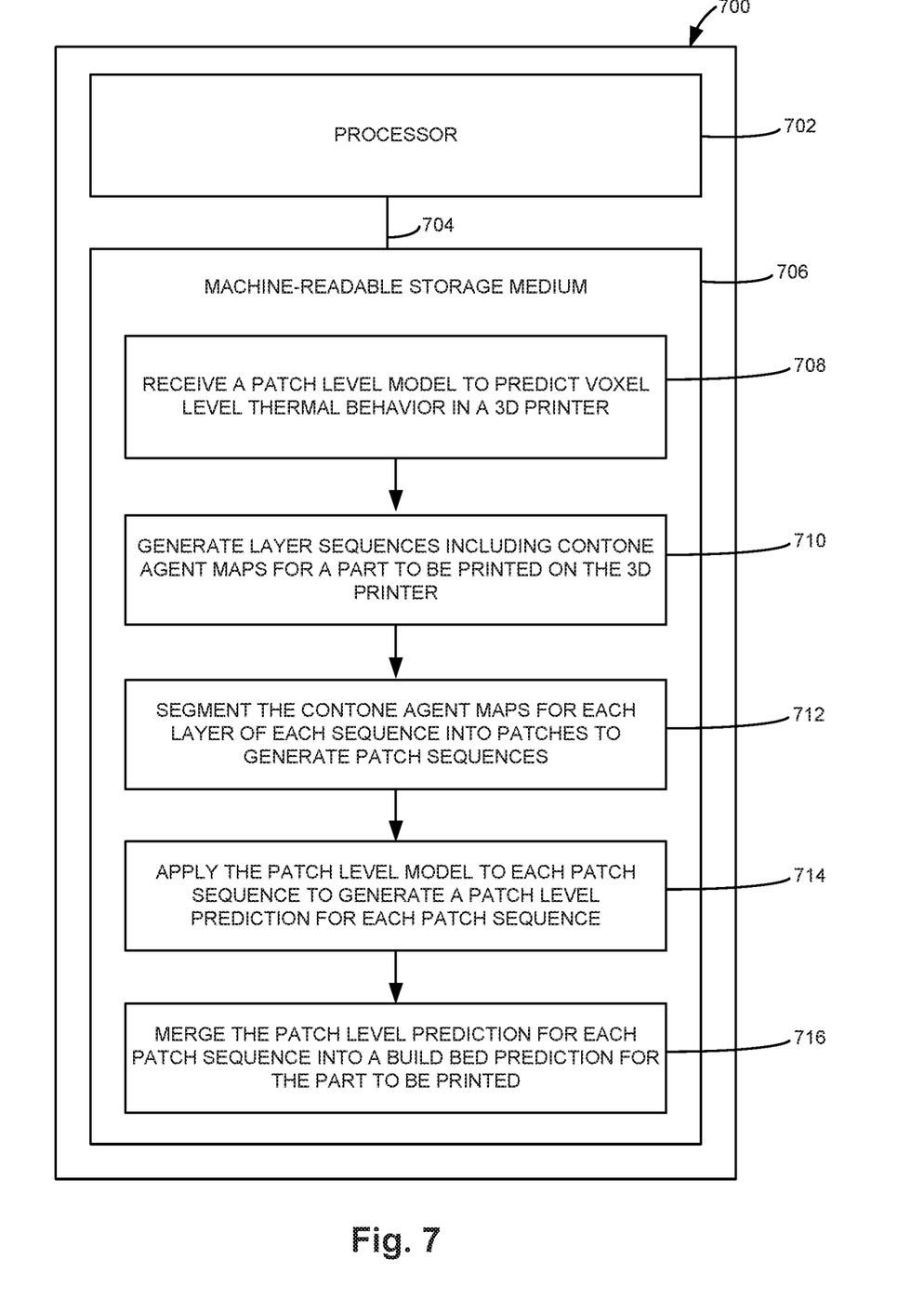
FIG. 7 is a block diagram illustrating one example of a processing system for predicting the thermal behavior of a three-dimensional (3D) printer.

FIG. 7 is a block diagram illustrating one example of a processing system for predicting the thermal behavior of a 3D printer. System 700 includes a processor 702 and a machine-readable storage medium 706. Processor 702 is communicatively coupled to machine-readable storage medium 706 through a communication path 704. Although the following description refers to a single processor and a single machine-readable storage medium, the description may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 702 includes one (i.e., a single) CPU or microprocessor or GPU or more than one (i.e., multiple) CPU or microprocessor or GPU, and/or other suitable hardware devices for retrieval and execution of instructions stored in machine-readable storage medium 706. Processor 702 may fetch, decode, and execute instructions 708-716 to predict the thermal behavior of a 3D printer. Processor 702 may fetch, decode, and execute instructions 708 to receive a patch level model to predict voxel level thermal behavior in a 3D printer. Processor 702 may fetch, decode, and execute instructions 710 to generate layer sequences including contone agent maps for a part to be printed on the 3D printer.

Processor 102 may fetch, decode, and execute instructions 712 to segment the contone agent maps for each layer of each sequence into patches to generate patch sequences. In one example, processor 102 may execute the instructions to segment the contone agent maps for each layer of each sequence into overlapping patches to generate the patch sequences. Processor 702 may fetch, decode, and execute instructions 714 to apply the patch level model to each patch sequence to generate a patch level prediction for each patch sequence. Processor 702 may fetch, decode, and execute instructions 714 to merge the patch level prediction for each patch sequence into a build bed prediction for the part to be printed. In one example, processor 702 may execute instructions to further receive a build bed level model to predict voxel level thermal behavior in the 3D printer and apply the build bed level model to each layer sequence to generate a build bed level prediction for each level sequence.

As an alternative or in addition to retrieving and executing instructions, processor 702 may include one (i.e., a single) electronic circuit or more than one (i.e., multiple) electronic circuit comprising a number of electronic components for performing the functionality of one of the instructions or more than one of the instructions in machine-readable storage medium 706. With respect to the executable instruction representations (e.g., boxes) described and illustrated herein, it should be understood that part or all of the executable instructions and/or electronic circuits included within one box may, in alternate examples, be included in a different box illustrated in the figures or in a different box not shown.

Machine-readable storage medium 706 is a non-transitory storage medium and may be any suitable electronic, magnetic, optical, or other physical storage device that stores executable instructions. Thus, machine-readable storage medium 706 may be, for example, RAM, EEPROM, a storage drive, an optical disc, and the like. Machine-readable storage medium 706 may be disposed within system 700, as illustrated in FIG. 7. In this case, the executable instructions may be installed on system 700. Alternatively, machine-readable storage medium 706 may be a portable, external, or remote storage medium that allows system 700 to download the instructions from the portable/external/remote storage medium. In this case, the executable instructions may be part of an installation package.

Figure 8:
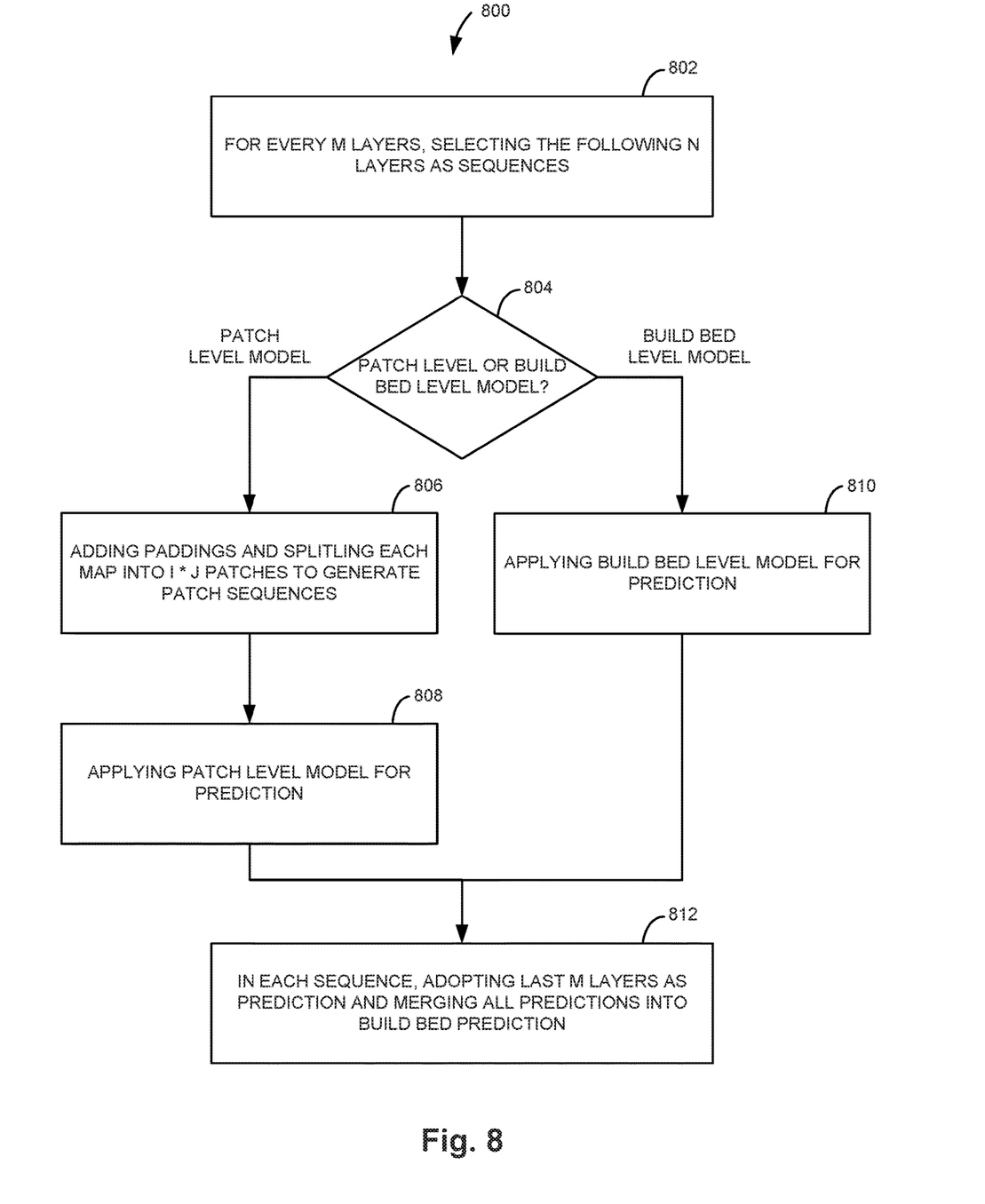
FIG. 8 is a flow diagram illustrating one example of a method for predicting the thermal behavior of a 3D printer.

FIG. 8 is a flow diagram illustrating one example of a method 800 for predicting the thermal behavior of a 3D printer. The contone agent maps of a part to be printed are generated and input to the trained model so that the thermal distribution maps of the fusing layer may be predicted before they are printed. At 802, method 800 includes for every M layers, selecting the following N layers as sequences. At 804, method 800 includes determining whether to use a patch level model or a build bed level model. At 806 in response to using a patch level model, method 800 includes adding paddings to map boundaries according to the map resolution and splitting each map into I*J patches with thermal stride overlapping to generate patch sequences. At 808, method 800 includes applying the patch level model to each patch sequence to calculate a prediction for each patch sequence and merging the prediction of each patch sequence back into the layer sequence with thermal stride overlapping.

At 810 in response to using a build bed level model, method 800 includes applying a build bed level model to each layer sequence to calculate a prediction for each layer sequence. At 812, method 800 includes for each layer sequence, adopting the last M layers as prediction and merging all predictions into a whole build bed prediction.

Figure 9A:
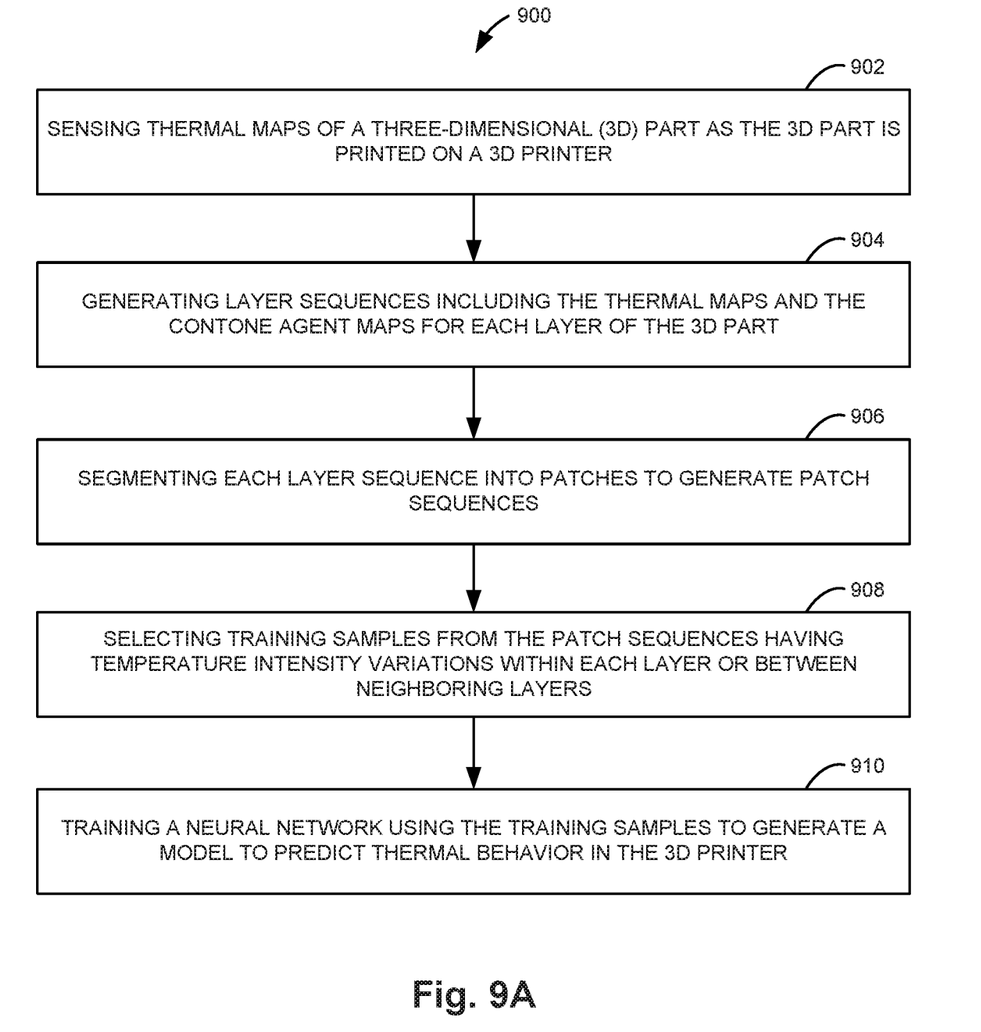
FIGS. 9A-9C are flow diagrams illustrating one example of a method for training a neural network and predicting the thermal behavior of a 3D printer.
Figure 9B:
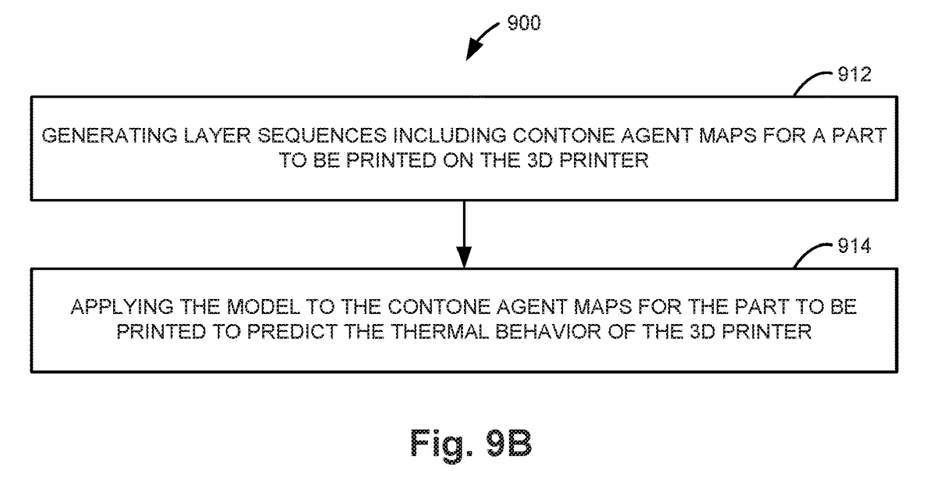
Figure 9C:
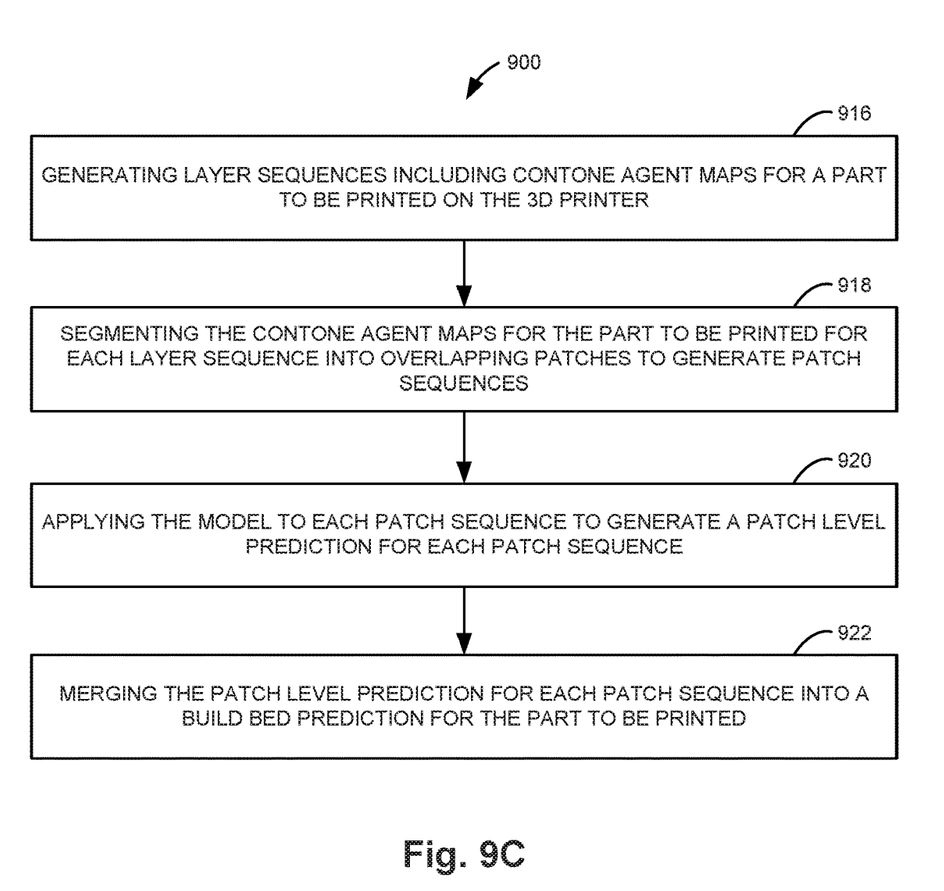

FIGS. 9A-9C are flow diagrams illustrating another example of a method 900 for predicting the thermal behavior of a 3D printer. As shown in FIG. 9A, at 902 method 900 includes sensing thermal maps of a three-dimensional (3D) part as the 3D part is printed on a 3D printer. At 904, method 900 includes generating layer sequences including the thermal maps and the contone agent maps for each layer of the 3D part. At 906, method 900 includes segmenting each layer sequence into patches to generate patch sequences.

At 908, method 900 includes selecting training samples from the patch sequences having temperature intensity variations within each layer or between neighboring layers. At 910, method 900 includes training a neural network using the training samples to generate a model to predict thermal behavior in the 3D printer. In one example, selecting training samples may include selecting first samples from each patch sequence having temperature intensity variations within each layer or between neighboring layers, selecting second samples from the first samples where the temperature intensity variations are influenced by the contone agent maps, and selecting third samples from the first samples where the temperature intensity variations are influenced by neighboring layers.

In this example, training the neural network may include training the neural network using the first samples, the second samples, or the third samples. Training the neural network may include training a spatial convolution neural network (CNN) using the second samples or training a spatiotemporal convolution long short-term memory network (Conv-LSTM) using the third samples. The spatial CNN and the spatiotemporal Conv-LSTM may be synthesized to provide a synthesis CNN to generate the model by keeping parameters trained in the spatial CNN and the spatiotemporal Conv-LSTM as pre-trained parameters and training a remainder of the synthesis CNN using the first samples.

As shown in FIG. 9B, at 912 method 900 may further include generating layer sequences including contone agent maps for a part to be printed on the 3D printer. At 914, method 900 may further include applying the model to the contone agent maps for the part to be printed to predict the thermal behavior of the 3D printer.

As shown in FIG. 9C, at 916 method 900 may further include generating layer sequences including contone agent maps for a part to be printed on the 3D printer. At 918, method 900 may further include segmenting the contone agent maps for the part to be printed for each layer sequence into overlapping patches to generate patch sequences. At 920, method 900 may further include applying the model to each patch sequence to generate a patch level prediction for each patch sequence. At 922, method 900 may include merging the patch level prediction for each patch sequence into a build bed prediction for the part to be printed.

Below is a sample portion of a log file that presents the information of valid patch sequences generated by the dataset screening criteria 1. The first line states that the 11th selected valid patch sequence has heat map entropy 3.95 and contone agent map entropy 2.73. This is the 12th sequence in the original dataset. Since in this example the threshold was set to 3.4, all the selected sequences have heat entropy larger than 3.4. Note: "fluid" here represents the contone agent maps.

Log of Valid Patch Sequences Generated by Dataset Screening Criteria 1
 entropy of sequence 11: heat: 3.951296 fluid: 2.727952
   from sequence 12
 entropy of sequence 12: heat: 3.458242 fluid: 1.511723
   from sequence 13
 entropy of sequence 13: heat: 3.794940 fluid: 2.068110
   from sequence 14
 entropy of sequence 14: heat: 4.188844 fluid: 2.575416
   from sequence 15 entropy of sequence 15: heat: 3.418982 fluid: 1.251414 from sequence 24
entropy of sequence 16: heat: 4.348054 fluid: 2.172862 from sequence 25
entropy of sequence 17: heat: 4.746036 fluid: 2.831270 from sequence 26
entropy of sequence 18: heat: 3.779898 fluid: 2.003610 from sequence 28
entropy of sequence 19: heat: 3.845399 fluid: 1.398514 from sequence 29
entropy of sequence 20: heat: 3.903442 fluid: 1.711382 from sequence 30

Below is a sample portion of a log file that presents the information of valid patches generated by the dataset screening criteria 2. For example, the first line means that the 30th selected valid image has heat map entropy 3.19, contone agent map entropy 1.73 and the modified heat entropy 2.40. This is the second patch in the first sequence in the previously selected valid dataset. Since here the subset to train the spatial CNN model is selected, single patches are used. In this example, the modified heat entropy was set at less than 2.5 and the fluid entropy was set at greater than 3.

Log of Valid Patches Generated by Dataset Screening Criteria 2
entropy of image 30 is: heat 3.195455 fluid: 1.738605 screening heat: 2.405989 from sequence 1_2
entropy of image 31 is: heat 3.644794 fluid: 1.887290 screening heat: 2.276824 from sequence 1_7
entropy of image 32 is: heat 3.503992 fluid: 2.020449 screening heat: 2.254236 from sequence 1_15
entropy of image 33 is: heat 3.284598 fluid: 2.029091 screening heat: 2.261601 from sequence 1_16
entropy of image 34 is: heat 3.442430 fluid: 2.066463 screening heat: 2.328123 from sequence 1_20
entropy of image 35 is: heat 3.573623 fluid: 2.080992 screening heat: 2.442239 from sequence 1_21
entropy of image 36 is: heat 3.558438 fluid: 2.092112 screening heat: 2.472555 from sequence 1_22
entropy of image 37 is: heat 3.566620 fluid: 2.131430 screening heat: 2.344483 from sequence 1_28
entropy of image 38 is: heat 3.726539 fluid: 2.430464 screening heat: 2.264269 from sequence 2_0
entropy of image 39 is: heat 3.772242 fluid: 2.440479 screening heat: 2.268581 from sequence 2_1
entropy of image 40 is: heat 3.837625 fluid: 2.452599 screening heat: 2.068755 from sequence 2_2

Below is a sample portion of a log file that presents the information of valid patch sequences generated by the dataset screening criteria 3. It shows the entropy of each patch in the selected valid sequences. In this sample sequence, the patch contone agent entropy decrease gradually, therefore it is selected.

Log of Valid Patch Sequences Generated by Dataset Screening Criteria 3
entropy of image 10_0 is: heat 3.550822 fluid: 1.437401 from sequence 23
entropy of image 10_1 is: heat 3.828140 fluid: 1.432116 from sequence 23
entropy of image 10_2 is: heat 3.587859 fluid: 1.440041 from sequence 23
entropy of image 10_3 is: heat 3.454897 fluid: 1.451451 from sequence 23
entropy of image 10_4 is: heat 3.410930 fluid: 1.449667 from sequence 23
entropy of image 10_5 is: heat 3.759084 fluid: 1.442882 from sequence 23
entropy of image 10_6 is: heat 3.790851 fluid: 1.445745 from sequence 23
entropy of image 10_7 is: heat 3.806567 fluid: 1.443900 from sequence 23
entropy of image 10_8 is: heat 3.520148 fluid: 1.439435 from sequence 23
entropy of image 10_9 is: heat 3.692496 fluid: 1.434374 from sequence 23
entropy of image 10_10 is: heat 3.492785 fluid: 1.428096 from sequence 23
entropy of image 10_11 is: heat 3.748625 fluid: 1.422057 from sequence 23
entropy of image 10_12 is: heat 3.452572 fluid: 1.421981 from sequence 23
entropy of image 10_13 is: heat 3.454210 fluid: 1.404960 from sequence 23
entropy of image 10_14 is: heat 3.537793 fluid: 1.395284 from sequence 23
entropy of image 10_15 is: heat 3.586692 fluid: 1.384841 from sequence 23
entropy of image 10_16 is: heat 3.544452 fluid: 1.364644 from sequence 23
entropy of image 10_17 is: heat 3.338013 fluid: 1.350116 from sequence 23
entropy of image 10_18 is: heat 3.321589 fluid: 1.338951 from sequence 23
entropy of image 10_19 is: heat 3.736011 fluid: 1.322798 from sequence 23
entropy of image 10_20 is: heat 3.686481 fluid: 1.295926 from sequence 23
entropy of image 10_21 is: heat 3.818633 fluid: 1.264831 from sequence 23
entropy of image 10_22 is: heat 3.396788 fluid: 1.220348 from sequence 23
entropy of image 10_23 is: heat 3.706410 fluid: 1.143074 from sequence 23
entropy of image 10_24 is: heat 3.386274 fluid: 1.035498 from sequence 23
entropy of image 10_25 is: heat 3.565374 fluid: 0.973151 from sequence 23
entropy of image 10_26 is: heat 3.543322 fluid: 0.931435 from sequence 23
entropy of image 10_27 is: heat 3.632569 fluid: 0.862613 from sequence 23
entropy of image 10_28 is: heat 3.109375 fluid: 0.782048 from sequence 23
entropy of image 10_29 is: heat 3.669149 fluid: 0.741596 from sequence 23

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:
1. A system comprising:
a machine readable storage medium storing instructions; and
a processor to execute the instructions to:
receive contone agent maps of a three-dimensional (3D) part and sensed thermal maps from the 3D printing of the 3D part on a 3D printer;

generate layer sequences including the contone agent maps and the sensed thermal map for each layer of the 3D part;

select training samples from the layer sequences having temperature intensity variations within each layer or between neighboring layers;

train a neural network using the training samples to generate a model to predict thermal behavior in the 3D printer;

generate layer sequences including contone agent maps for a part to be printed on the 3D printer;

segment the contone agent maps for the part to be printed for each layer sequence into overlapping patches to generate patch sequences;

apply the model to each patch sequence to generate a patch level prediction for each patch sequence; and merge the patch level prediction for each patch sequence into a build bed prediction for the part to be printed.

2. The system of claim 1, wherein the processor is to execute the instructions to select training samples to:

select first samples from each layer sequence having temperature intensity variations within each layer or between neighboring layers;

select second samples from the first samples where the temperature intensity variations are influenced by the contone agent maps; and select third samples from the first samples where the temperature intensity variations are influenced by neighboring layers, wherein the first samples, the second samples, and the third samples are used to train the neural network.

3. The system of claim 2, wherein the processor is to execute the instructions to train the neural network to train a spatial convolution neural network (CNN) using the second samples and to train a spatiotemporal convolution long short-term memory network (Conv-LSTM) using the third samples.

4. The system of claim 3, wherein the processor is to execute the instructions to train the neural network to train a synthesis convolution neural network (CNN) using the first samples while fixing the parameters in the spatial CNN and the Conv-LSTM as pre-trained parameters.

5. The system of claim 1, wherein the contone agent maps comprise fusing agent distribution maps and detailing agent distribution maps.

6. A system comprising:
a machine readable storage medium storing instructions; and
a processor to execute the instructions to:
receive a patch level model to predict voxel level thermal behavior in a 3D printer;
generate layer sequences including contone agent maps for a part to be printed on the 3D printer;
segment the contone agent maps for the part to be printed for each layer of each sequence into overlapping patches to generate patch sequences;
apply the patch level model to each patch sequence to generate a patch level prediction for each patch sequence; and
merge the patch level prediction for each patch sequence into a build bed prediction for the part to be printed.

7. The system of claim 6, wherein the processor is to execute the instructions to further:

receive a build bed level model to predict voxel level thermal behavior in the 3D printer; and
apply the build bed level model to each layer sequence to generate a build bed level prediction for each level sequence.

8. A method comprising:
sensing thermal maps of a three-dimensional (3D) part as the 3D part is printed on a 3D printer;
generating layer sequences including the thermal maps and the contone agent maps for each layer of the 3D part;
segmenting each layer sequence into patches to generate patch sequences;
selecting training samples from the patch sequences having temperature intensity variations within each layer or between neighboring layers;
training a neural network using the training samples to generate a model to predict thermal behavior in the 3D printer;
generating layer sequences including contone agent maps for a part to be printed on the 3D printer;
segmenting the contone agent maps for the part to be printed for each layer sequence into overlapping patches to generate patch sequences;
applying the model to each patch sequence to generate a patch level prediction for each patch sequence; and
merging the patch level prediction for each patch sequence into a build bed prediction for the part to be printed.

9. The method of claim 8, wherein selecting training samples comprises:
selecting first samples from each patch sequence having temperature intensity variations within each layer or between neighboring layers;
selecting second samples from the first samples where the temperature intensity variations are influenced by the contone agent maps; and
selecting third samples from the first samples where the temperature intensity variations are influenced by neighboring layers,
wherein training the neural network comprises training the neural network using the first samples, the second samples, or the third samples.

10. The method of claim 9, wherein training the neural network comprises:
training a spatial convolution neural network (CNN) using the second samples;
training a spatiotemporal convolution long short-term memory network (Conv-LSTM) using the third samples; and
synthesizing the spatial CNN and the spatiotemporal Conv-LSTM to provide a synthesis CNN to generate the model by keeping parameters trained in the spatial CNN and the spatiotemporal Conv-LSTM as pre-trained parameters and training a remainder of the synthesis CNN using the first samples.

11. The method of claim 8, further comprising:
generating layer sequences including contone agent maps for a part to be printed on the 3D printer; and
applying the model to the contone agent maps for the part to be printed to predict the thermal behavior of the 3D printer.

* * * * *